(12) United States Patent
Nicholas et al.

(10) Patent No.: US 11,592,241 B2
(45) Date of Patent: Feb. 28, 2023

(54) JET IMPINGEMENT COOLING APPARATUS AND METHOD

(71) Applicant: Oxford University Innovation Limited, Oxford (GB)

(72) Inventors: Jack Nicholas, Oxford (GB); Tsun Holt Wong, Oxford (GB); Robert Pearce, Oxford (GB); Peter Ireland, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 17/058,243

(22) PCT Filed: May 10, 2019

(86) PCT No.: PCT/GB2019/051290
§ 371 (c)(1),
(2) Date: Nov. 24, 2020

(87) PCT Pub. No.: WO2019/229415
PCT Pub. Date: Dec. 5, 2019

(65) Prior Publication Data
US 2021/0210218 A1  Jul. 8, 2021

(30) Foreign Application Priority Data
May 29, 2018 (GB) .................................... 1808726

(51) Int. Cl.
*F28F 3/02* (2006.01)
*F28F 13/02* (2006.01)
(Continued)

(52) U.S. Cl.
CPC ............... *F28F 3/025* (2013.01); *G21B 1/13* (2013.01); *G21C 15/02* (2013.01); *F28F 13/02* (2013.01); *H01L 23/4735* (2013.01)

(58) Field of Classification Search
CPC ..... G21B 1/13; F28F 3/00; F28F 3/005; F28F 3/02; F28F 3/025; F28F 3/04; F28F 3/048;
(Continued)

(56) References Cited

U.S. PATENT DOCUMENTS 3,205,147 A * 9/1965 Foure ..................... F28F 27/02
376/455
8,391,008 B2 * 3/2013 Dede .................. H05K 7/20927
361/689
(Continued)

FOREIGN PATENT DOCUMENTS

EP   2 151 863 A1   2/2010

OTHER PUBLICATIONS

International Search Report and Written Opinion for WO2019/229415 (PCT/GB2019/051290), dated Jul. 15, 2019, pp. 1-14.
(Continued)

*Primary Examiner* — Darlene M Ritchie
(74) *Attorney, Agent, or Firm* — Thomas|Horstemeyer, LLP

(57) ABSTRACT

Apparatus and methods for jet impingement cooling are provided. In one arrangement, a fluid channelling structure engages against a target surface to define a flow volume. Fluid is jetted onto the target surface from inlets and is removed via outlets. Flow directing features form a plurality of channels with no straight paths between inlets and outlets. A time averaged flow direction of fluid in contact with each flow directing feature is more nearly perpendicular to a direction of jetting of the fluid from a nearest inlet than
(Continued)

parallel to the direction of jetting One or more pairs of the inlets and outlets are such that a majority of fluid jetted onto the target surface from the inlet of the pair will be removed from the flow volume through the outlet of the same pair.

24 Claims, 4 Drawing Sheets

(51) Int. Cl.
    *G21B 1/13*     (2006.01)
    *G21C 15/02*     (2006.01)
    *H01L 23/473*     (2006.01)

(58) Field of Classification Search
    CPC ... F28F 3/12; F28F 13/02; F28F 3/086; G21C 13/04; G21C 15/02; G21C 15/22; H01L 23/4735; Y02E 30/10; Y02E 30/30
    USPC .............................. 165/104.33, 104.19, 908
    See application file for complete search history.

(56) References Cited

U.S. PATENT DOCUMENTS

| | | | |
|---|---|---|---|
| 9,099,295 B2 | 8/2015 | Kuhlmann et al. | |
| 9,460,985 B2 | 10/2016 | Joshi et al. | |
| 2007/0119565 A1 | 5/2007 | Brunschwiler et al. | |
| 2009/0145581 A1 | 6/2009 | Hoffman et al. | |
| 2012/0170222 A1* | 7/2012 | Dede ..................... | F28F 3/083 |
| | | | 165/173 |
| 2014/0260256 A1 | 9/2014 | Loebig et al. | |
| 2017/0092565 A1 | 3/2017 | Chen et al. | |
| 2017/0292703 A1 | 10/2017 | Pinnick et al. | |
| 2019/0343019 A1* | 11/2019 | Todorovic ............ | H05K 9/0022 |

OTHER PUBLICATIONS

UK Search Report for GB 1808726.2, dated Sep. 7, 2018, pp. 1-3.
Nicholas et al., "Development of a high-heat flux cooling element with potential application in a near-term fusion power plant divertor", Fusion Engineering and Design, vol. 96-97, Oct. 1, 2015, pp. 136-141.
Ihli et al., An advanced He-cooled divertor concept: Design, cooling technology, and thermohydraulic analyses with CFD, Fusion Engineering and Design, vol. 75-79, Nov. 1, 2005, pp. 371-375.
International Preliminary Report on Patentability for WO2019/229415 (PCT/GB2019/051290), dated Dec. 1, 2020, pp. 1-7.

* cited by examiner

JET IMPINGEMENT COOLING APPARATUS AND METHOD

CROSS-REFERENCE TO RELATED APPLICATIONS

This application is the National Stage of International Application No. PCT/GB2019/051290, filed May 10, 2019, which claims priority to GB 1808726.2, filed May 29, 2018, which are entirely incorporated herein by reference.

The program leading to this application has received funding from the Euratom research and training programme 2014-2018 under grant agreement no. 633053.

The invention relates to jet impingement cooling apparatuses and methods.

Nuclear fusion represents a promising source of energy to help meet the growing demand for electricity. One of the leading candidates for a practical fusion reactor is the tokomak, in which a powerful magnetic field confines a hot plasma within a torus shaped vacuum vessel. As the plasma diffuses radially across the last closed magnetic flux surface it enters a region called the scrape-off layer. Plasma that enters this region is swept towards a region of the vessel wall called the divertor. This helps keep impurities in the core plasma to a minimum, and also facilitates removal of the byproducts of the fusion reaction. However, the impingement of this high energy plasma on the divertor results in the generation of extremely high-heat fluxes. It has proven challenging to design cooling systems that can provide sufficient performance for divertor applications.

An example of a known cooling system in the aerospace and semiconductor industries is jet impingement, where high pressure fluid is jetted from an inlet onto a surface to be cooled, thereby enhancing heat transfer from the surface by minimising the thermal boundary layer thickness. An example of such a device is disclosed in US-A-2007/119565. Also known are cooling systems which pass fluid through an array of narrow channels adjacent to a surface to be cooled. A known problem of existing jet impingement cooling systems is that they do not provide a uniform heat transfer coefficient distribution on the impingement surface. This effect can be minimised by using a high jet density array. However, this can increase the pumping power requirements to remove a unit of heat, and makes manifolding particularly difficult. Additionally, the heat transfer performance of multi jet systems is often hampered by the build-up of cross-flow.

It is an object of the invention to provide improved jet impingement cooling.

According to an aspect of the invention, there is provided a jet impingement cooling apparatus comprising: a fluid channelling structure configured to engage against a target surface and thereby define a flow volume through which a fluid can flow, the fluid channelling structure comprising: a plurality of inlets, each inlet opening into the flow volume and configured to allow a fluid to be jetted directly onto the target surface from the inlet; a plurality of outlets, each outlet opening into the flow volume and configured to allow a fluid to be removed from the flow volume through the outlet; and a plurality of flow directing features together forming a plurality of channels fluidly connecting the inlets and the outlets, wherein the flow directing features are arranged such that there is no straight path through the flow volume from a region of the flow volume facing any one of the inlets to a region of the flow volume facing any one of the outlets, wherein: the flow directing features are configured such that, in use, a time averaged flow direction of fluid in contact with a surface of each flow directing feature is more nearly perpendicular to a direction of jetting of the fluid from a nearest inlet than parallel to said direction of jetting, for at least a majority of the surface of the flow directing feature; and one or more pairs of the inlets and outlets are configured such that a majority of fluid jetted onto the target surface from the inlet of the pair will be removed from the flow volume through the outlet of the same pair.

Thus a device is provided which combines the advantages of jet impingement cooling and cooling channels. Ensuring that there are no straight paths through the flow volume maintains high flow velocities in the flow volume, ensures coverage of the entire area of the target surface by the fluid, and disrupts boundary layers, thereby enhancing cooling. Configuring the inlets and outlets in pairs in the manner described, which allows for the option of one or more of the pairs sharing an outlet, allows for the flow of fluid to be directed to specific areas more effectively, thereby improving uniformity of cooling of the target surface and allowing fluid to be removed efficiently from the flow volume.

In an embodiment, for each pair of inlets and outlets, a flow path from a region of the flow volume facing the inlet to a region of the flow volume facing the outlet is partially defined by the target surface along all of the flow path such that the fluid is continuously in contact with the target surface along all of the flow path. The fluid flow is thus directed along the target surface for the majority of its flow through the flow volume, thereby maximising the cooling provided.

In an embodiment, for each of one or more of said pairs of the inlets and outlets, a majority of fluid removed from the flow volume through the outlet of the pair is fluid that was jetted onto the target surface through the inlet of the same pair. This approach creates a one-to-one correspondence of the flow of fluid between pairs of inlets and outlets, further improving the ability to direct the flow of fluid within the apparatus.

In an embodiment, the target surface comprises a cooled region that is cooled by the fluid in use; and at least one of the inlets is provided within a distance less than three times the diameter of an opening of the inlet from an outer boundary of the cooled region. This approach provides greater cooling near the edges of the apparatus, thereby reducing temperature peaking.

In an embodiment, the apparatus comprises a plurality of the fluid channelling structures in a cascade arrangement; and the cascade arrangement is such that, in use, fluid flowing out of the flow volume of a first fluid channelling structure of the plurality of fluid channelling structures via outlets of the first fluid channelling structure flows into the flow volume of a second fluid channelling structure of the plurality of fluid channelling structures via inlets of the second fluid channelling structure. This approach uses a cascade arrangement, where fluid flowing through the apparatus will impinge on the surface multiple times, effectively being re-used in different areas of the target surface. This allows the same cooling performance to be achieved using a lower total flow rate of fluid through the apparatus, thereby improving efficiency.

In an embodiment, a total cross-sectional area of openings of the outlets is larger than a total cross-sectional area of openings of the inlets. This approach ensures that fluid can flow out of the flow volume efficiently, reducing pressure losses in undesired parts of the apparatus.

According to an aspect of the invention, there is provided a method of cooling using jet impingement, comprising: providing a fluid channelling structure engaged against a target surface to define a flow volume through which a fluid can flow; driving a flow of fluid through the flow volume by jetting a fluid into the flow volume through a plurality of inlets and onto the target surface and removing the fluid from the flow volume through a plurality of outlets; and: providing a plurality of flow directing features together forming a plurality of channels fluidly connecting the inlets and the outlets, wherein: the flow directing features are arranged such that there is no straight path through the flow volume from a region facing any one of the inlets to a region facing any one of the outlets; a time averaged flow direction of fluid in contact with a surface of each flow directing feature is more nearly perpendicular to a direction of jetting of the fluid from a nearest inlet than parallel to said direction of jetting, for at least a majority of the surface of the flow directing feature; and one or more pairs of the inlets and outlets are such that a majority of fluid jetted onto the target surface from the inlet of the pair is removed from the flow volume through the outlet of the same pair.

In an embodiment, the target surface is heated by a heat source on an opposite side of the target surface to the fluid channelling structure; and a highest heat transfer coefficient between the target surface and fluid flowing in the flow volume is provided in each of one or more target regions of the target surface; and each target region has a cooling requirement, averaged over the target region, that is at least 5% higher than an average cooling requirement, averaged over the whole target surface, wherein a cooling requirement is the product of the heat flux received by a region of the opposite side of the target surface directly opposite the target region from the heat source, and the thermal conductive path length between the target region and the region of the opposite side of the target surface directly opposite the target region.

This approach ensures that the most efficient cooling is provided in regions of the target surface that need the highest cooling.

In an embodiment, a plurality of the fluid channelling structures are provided in a cascade arrangement; and the cascade arrangement is such that fluid that flows out of the flow volume of a first fluid channelling structure of the plurality of fluid channelling structures via outlets of the first fluid channelling structure flows into the flow volume of a second fluid channelling structure of the plurality of fluid channelling structures via inlets of the second fluid channelling structure.

This approach uses a cascade arrangement, where fluid flowing through the apparatus will impinge on the surface multiple times, effectively being re-used in different areas of the target surface. This allows the same cooling performance to be achieved using a lower total flow rate of fluid through the apparatus, thereby improving efficiency.

In an embodiment, the target surface is heated by a heat source on an opposite side of the target surface to the fluid channelling structures; the first fluid channelling structure is engaged with a first sub-region of the target surface and the second fluid channelling structure is engaged with a second sub-region of the target surface; and a cooling requirement of the first sub-region is higher than a cooling requirement of the second sub-region, wherein: the cooling requirement of the first sub-region is the average over the first sub-region of the product of the heat flux received from the heat source by a first region of the opposite side of the target surface directly opposite the first sub-region, and the thermal conductive path length between the first sub-region and the first region of the opposite side of the target surface directly opposite the first sub-region; and the cooling requirement of the second sub-region is the average over the second sub-region of the product of the heat flux received from the heat source by a second region of the opposite side of the target surface directly opposite the second sub-region, and the thermal conductive path length between the second sub-region and the second region of the opposite side of the target surface directly opposite the second sub-region.

This approach ensures that the most efficient cooling is provided in regions of the target surface that need the highest cooling, whilst also reducing the total flow rate of fluid needed in the apparatus using the cascade arrangement.

In an embodiment, the fluid jetted from the inlets does not change phase whilst inside the flow volume. This approach ensures that the flow characteristics of the fluid do not change inside the flow volume, thereby providing more predictable and reliable flow and cooling performance.

Embodiments of the invention will now be described, by way of example only, with reference to the accompanying drawings in which corresponding reference symbols represent corresponding parts, and in which.

Figure 1:
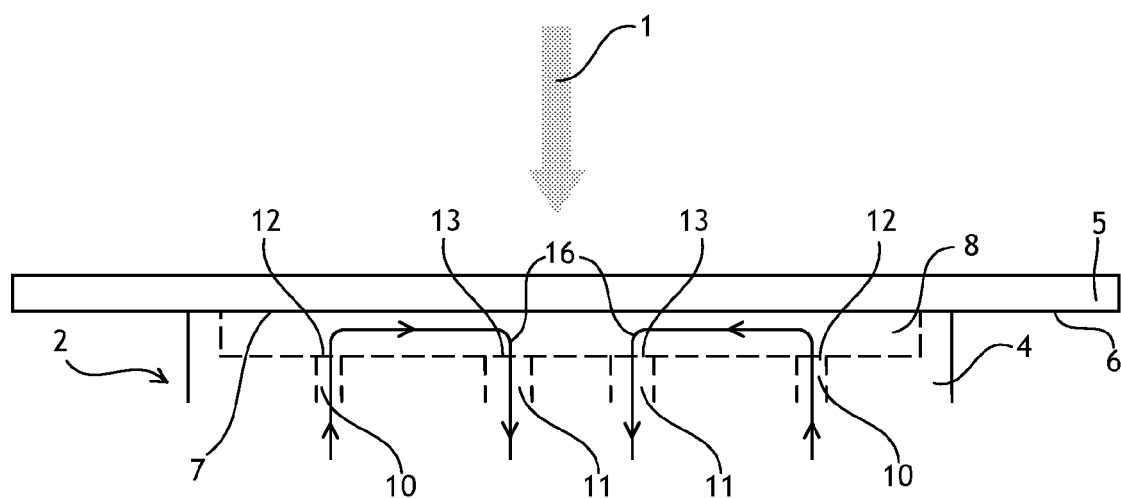
FIG. 1 is a side-sectional view showing a cooling apparatus engaged with a target surface.

In an embodiment, examples of which are depicted in FIGS. 1-8, there is provided a cooling apparatus 2. The apparatus 2 is suitable for cooling a target surface 6 by jet impingement. The target surface 6 receives a heat flux from a heat source 1. The nature of the heat source 1 is not particularly limited. For example, the target surface 6 could be inside a tokomak fusion reactor, an array of laser diodes in a solid-state laser, a microprocessor chip, a solid-state inverter, or any other surface which receives a high heat flux. The target surface 6 may be planar, or may have another shape, such as a convex or concave curvature. By virtue of features described below, the apparatus 2 is capable of providing a cooling performance equivalent or superior to prior art devices using a lower total mass flow rate of coolant fluid.

In an embodiment, the apparatus 2 comprises a fluid channelling structure 4 configured to engage against the target surface 6 and thereby define a flow volume 8 through which a fluid can flow. In an embodiment, the fluid channelling structure 4 is non-integrally formed relative to the target surface (such that there is a recognisable interface between material forming the fluid channelling structure 4 and material forming the target surface 6). In other embodiments, the fluid channelling structure 4 is integrally connected to the target surface 6. The fluid channelling structure 4 may be formed from any material or combination of materials that allows fluid to flow in the flow volume 8 at the temperatures and pressures necessary for the apparatus 2 to function. For example, the fluid channelling structure 4 may comprise copper or oxygen-free high thermal conductivity copper, or alloys of copper such as CuCrZr.

In an embodiment, the flow volume 8 is adjacent to the target surface 6. In an embodiment, the fluid channelling structure 4 is configured to engage detachably against the target surface 6. In an embodiment, the fluid channelling structure 4 can be removed from the target surface 6 when not in use, to allow inspection or maintenance of the target surface 6 or fluid channelling structure 4.

In an embodiment, the fluid channelling structure 4 comprises a plurality of inlets 10. Each inlet 10 opens into the flow volume 8 and allows a fluid to be jetted directly onto the target surface 6 from the inlet 10 and into the flow volume 8. In an embodiment, the inlets 10 are on the opposite side of the flow volume 8 to the target surface 6. The inlets 10 may thus face the target surface 6. In an embodiment, each inlet 10 comprises an opening 12 where the inlet 10 opens into the flow volume 8. In an embodiment, the openings 12 of the inlets 10 all lie in the same plane. The shape and size of each opening 12 is not particularly limited. For instance each of one or more of the openings 12 may comprise an elongate feature such as a slot, or a square, a rectangle, an oval or a circle. In an embodiment, each of one or more of the inlets 10 comprises a circular opening 12. The area of the openings 12 of the inlets 10 may be chosen to control the velocity of fluid jetted from the inlet 10 for a given fluid pressure. In an embodiment, the inlets 10 are circular with a diameter between 0.1 mm and 5 mm, optionally between 0.5 mm and 3 mm, optionally between 1 mm and 2 mm.

In an embodiment, the fluid channelling structure 4 further comprises a plurality of outlets 11. Each outlet 11 allows fluid in the flow volume 8 (jetting into the flow volume 8 via the inlets) to be removed from the flow volume 8 through the outlet 11. In an embodiment, the outlets 11 are on the opposite side of the flow volume 8 to the target surface 6. The outlets 11 thus face the target surface 6. In an embodiment, each outlet 11 comprise an opening 13 where the outlet 11 opens into the flow volume 8. In an embodiment, the openings 13 of the outlets 11 all lie in the same plane. The openings 13 of the outlets 11 may take any of the forms described above for the inlets 10. In an embodiment, each of the openings 13 of the outlets 11 is larger than each of the openings 12 of the inlets 10. In an embodiment, a total cross-sectional area of the openings 13 of the outlets 11 is larger than a total cross-sectional area of openings 12 of the inlets 10. Increasing the relative size of the outlets 11 reduces a drop in fluid pressure across the outlets 11 when fluid flows through the apparatus 2. In an embodiment, the openings 13 of the outlets 11 lie in the same plane as the openings 12 of the inlets 10, or in a plane parallel to the plane of the openings 12 of the inlets 10. In an embodiment, the outlets 11 comprise circular openings with diameters between 0.5 mm and 10 mm, optionally between 2 mm and 3 mm.

In an embodiment, the fluid channelling structure 4 further comprises a plurality of flow directing features 20. The flow directing features 20 together form a plurality of channels 25. The plurality of channels 25 fluidly connect the inlets 10 and the outlets 11. In an embodiment, one or more of the flow directing features 20 are in good thermal contact with each other and with the target surface 6 when the fluid channelling structure 4 is engaged against the target surface 6.

The flow directing features 20 may perform multiple useful functions. In an embodiment, the flow directing features 20 direct the flow of fluid within the flow volume 8 in such a way as to increase the surface area of the fluid channelling structure 4 that is in contact with the fluid within the flow volume 8. Increasing the surface area of the fluid channelling structure 4 in contact with the fluid helps to remove heat from the target surface 6 (by transferring heat to the fluid) more efficiently, particularly if one or more of the flow directing features 20 is in good thermal contact with the target surface 6 (such that heat flows from the target surface 6 into the flow directing feature 20 and then into the fluid). To further improve heat transfer, the flow directing features 20 may be formed of high thermal conductivity materials such as copper or copper alloys. In an embodiment, the flow directing features 20 also increase turbulence in the flow of fluid within the flow volume 8. Turbulence increases the efficiency of heat transfer into the fluid by improving mixing of the fluid. Turbulence also disrupts the formation of a thermal boundary layer, thereby further improving fluid mixing and efficiency of heat transfer.

A flow of fluid may be characterised by a Reynolds number. Higher Reynolds numbers tend to indicate that the flow is turbulent, while lower Reynolds numbers tend to indicate laminar flow. Since turbulent flow is advantageous for improving heat transfer and fluid mixing, the fluid channelling structure 4 and/or the flow directing features 20 may be configured such that the flow of fluid through the flow volume 8 has an increased Reynolds number relative to when the flow directing features 20 are not provided. In an embodiment, at least the jetting of the fluid onto the target surface 6 is performed in highly turbulent conditions. In an embodiment, the fluid is jetted from the inlets 10 in a flow having a Reynolds number greater than 4000, optionally higher than 6000.

In an embodiment, the flow directing features 20 increase the strength and rigidity of the fluid channelling structure 4. Increasing the strength and rigidity allows higher fluid pressures to be used. Higher fluid pressures increase the rate of fluid flow through the apparatus 2 and thereby improve the performance of the apparatus 2. In an embodiment, improved transfer of heat into the fluid provided by the flow directing features 20 reduces thermal gradients within the apparatus 2. Reducing thermal gradients reduces thermal stress and improves the durability of the apparatus 2. Thermal gradients are reduced in particular by reducing the temperature gradient between the target surface 6 and the fluid channelling structure 4.

In an embodiment, each of one or more of the flow directing features 20 comprises one or more of the following (see FIG. 7 for example): a pedestal 21, a wall 22, and a fin 23. A pedestal 21 is an example of a feature which primarily disrupts the thermal boundary layer in the fluid. Pedestals 21 may be non-elongate features that extend across the full height of the flow volume 8 and contact directly with the target surface 6. A wall 22 is an example of a feature which primarily directs fluid flow within the flow volume 8. Walls 22 may be elongate features that extend across the full height of the flow volume 8 and contact directly with the target surface 6. A fin 23 is an example of a feature which primarily increases turbulence in the fluid. Fins 23 may be elongate or non-elongate features and extend only partially across the height of the flow volume 8 and are not in direct contact with the target surface 6. Any combination of one or more of these types of flow directing feature 20, and other types of flow directing feature 20, may be used to direct the flow of fluid as desired and increase the surface area of the fluid channelling structure 4 that is in contact with the fluid.

In an embodiment, the flow directing features 20 are arranged such that there is no straight path through the flow volume 8 from a region of the flow volume 8 facing any one of the inlets 10 (e.g. the region directly in between an opening 12 of an inlet 10 and the target surface 6, through which the fluid is jetted onto the target surface 6) to a region of the flow volume 8 facing any one of the outlets 11 (e.g. the region directly in between an opening 13 of the outlet 11 and the target surface). The lack of straight paths increases the velocity of flow through the flow volume 8. The lack of straight paths also increases the surface area of the apparatus 2 in contact with the fluid by forcing the fluid to flow across or around the flow directing features 20.

In an embodiment, one or more pairs of the inlets 10 and outlets 11 are configured such that a majority of fluid jetted onto the target surface 6 through the inlet 10 of the pair will be removed from the flow volume 8 through the outlet 11 of the same pair. This feature provides a predictable correspondence of flow through the flow volume 8, so that the flow can be more easily controlled so as to improve the performance of the apparatus 2, as described in more detail later. In an embodiment, each of one or more of the pairs of inlets 10 and outlets 11 share the same outlet 11. Thus, the correspondence between inlets and outlets may comprise a many-to-one correspondence. There may be more inlets 10 than outlets 11.

In an embodiment, a time averaged flow direction of fluid in contact with a surface of each flow directing feature 20 is more nearly perpendicular to a direction of jetting of the fluid from a nearest inlet 10 than parallel to the direction of jetting, for at least a majority of the surface of the flow directing feature 20 in contact with the fluid (optionally for all of the surface of the flow directing feature 20 in contact with the fluid). This ensures that the flow of fluid in the apparatus 2 is largely diverted in a consistent plane, improving the ability to control the direction of flow. In accordance with the above, in an embodiment, a component of the time averaged flow direction of fluid in contact with the surface of each flow directing feature 20 perpendicular to the direction of jetting of the fluid from the nearest inlet 10 is larger than, optionally at least two times larger than, optionally at least 10 times larger than, optionally at least 100 times larger than, a component of the time averaged flow direction parallel to the direction of jetting, for at least a majority of the surface of the flow directing feature 20, optionally for all of the surface of the flow directing feature 20.

In an embodiment, for each of the pairs of the inlets and outlets for which a majority of fluid jetted onto the target surface 6 through the inlet 10 of the pair will be removed from the flow volume 8 through the outlet 11 of the same pair, a flow path 16 from a region of the flow volume 8 facing the inlet 10 to a region of the flow volume 8 facing the outlet 11 is partially defined by the target surface 6 along all of the flow path 16 such that the fluid is continuously in contact with the target surface 6 along all of the flow path 16. Keeping the fluid in contact with the target surface 6 along the flow path 16 increases the surface area of the target surface 6 in contact with the fluid, thereby improving transfer of heat from the target surface 6 to the fluid. This may be achieved by configuring the flow channelling structure 4 and flow directing features 20 such that flow in the flow volume 8 is predominantly parallel to the target surface 6.

In FIG. 1, the fluid channelling structure 4 is shown engaged with the target surface 6 and thereby defining a flow volume 8. The flow volume 8 covers an area of the target surface 6 and so defines a cooled region 7 of the target surface 6 that is cooled by fluid flowing in the flow volume 8. In an embodiment, the cooled region 7 is defined as the smallest polygon (e.g. square, rectangle, hexagon, etc.) that can completely surround all of the regions of the target surface 6 that are directly in contact with the fluid in use. Fluid flows into the flow volume 8 through the inlets 10, and leaves the flow volume 8 through the outlets 11. The fluid channelling structure 4 engages sealingly against the target surface 6 such that fluid flowing in the flow volume 8 cannot leave the flow volume 8 except through the outlets 11. In this embodiment, the target surface 6 is a surface of a plate 5 heated by a heat source 1 on an opposite side of the plate 5 (i.e. on the opposite side of the target surface 6) to the fluid channelling structure 4. In the embodiment shown, the target surface 6 defined by the plate 5 is substantially planar. In other embodiments, the target surface 6 may be curved. The heat source 1 may comprise a fluid or solid at a higher temperature than the plate 5, an influx of radiation, or any other source of heat energy.

Figure 2:
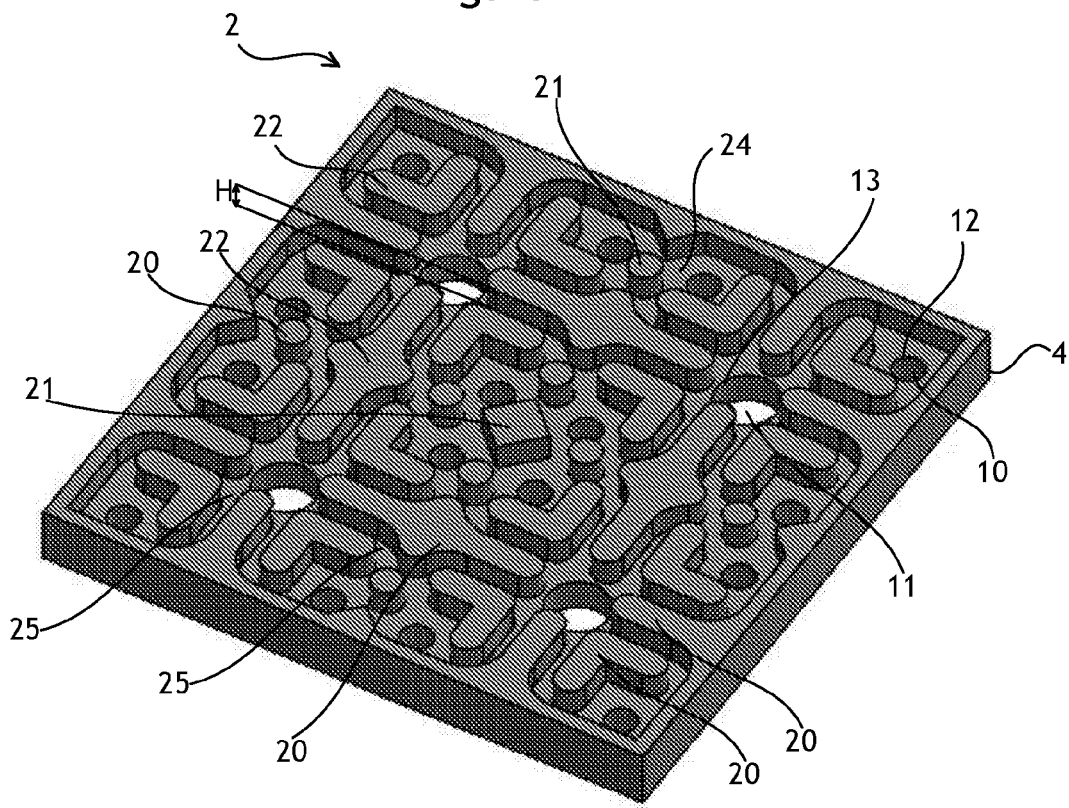
FIG. 2 is a perspective view of the cooling apparatus of FIG. 1.

In the embodiment of FIG. 2 the inlets 10 and outlets 11 have circular openings 12, 13 that are provided in the same plane. The flow directing features 20 comprise pedestals 21 and walls 22. The flow directing features 20 extend away from the plane of the openings 12, 13 of the inlets 10 and outlets 11, and define a plurality of channels 25 between the inlets 10 and outlets 11. In the embodiment of FIG. 2, the openings 12, 13 are provided in the ceiling 24 of the channels 25. In other embodiments, the openings 12, 13 may protrude from the ceiling 24. The height H of the channel 25 is the distance between the ceiling 24 and the target surface 6 when the fluid channelling structure 4 is engaged with the target surface 6. The flow directing features 20 in FIG. 2 extend the full height H of the channel 25. In other embodiments, one or more of the flow directing features 20 do not extend the full height H of the channel 25. In some embodiments, the height H of the channels 25 is between 0.1 mm and 4 mm, optionally between 0.5 mm and 1.5 mm, optionally between 0.75 mm and 1.25 mm. In some embodiments, the width of the channels 25 is between 0.25 mm and 2 mm, optionally between 0.5 mm and 1.5 mm, optionally between 0.75 mm and 1.25 mm.

The embodiment of FIG. 2 advantageously provides a high ratio between the area of the target surface 6 covered by the fluid channelling structure 4 (the heat flux area) and the surface area of the apparatus 2 in contact with the fluid flowing through the flow volume 8 (the wetted area). The ratio of wetted area to heat flux area may be greater than 0.8:1, preferably greater than 1:1, more preferably greater than 1.2:1.

Figure 3:
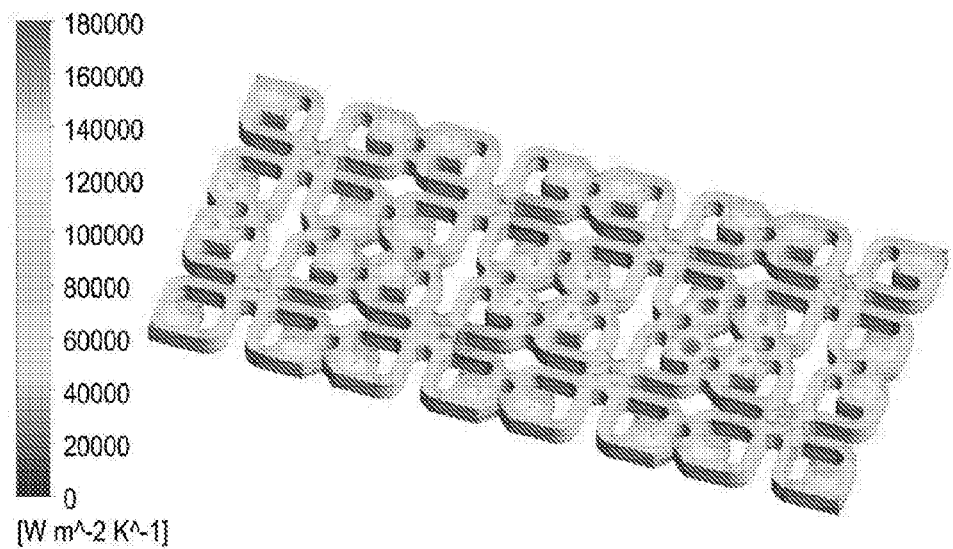
FIG. 3 is a plot showing the heat transfer coefficient at different points within a cooling apparatus.

FIG. 3 shows the heat transfer coefficient between the target surface 6 and the fluid flowing through the flow volume 8 calculated at different points within the flow volume 8. The heat transfer coefficient (measured in $Wm^{-2}K^{-1}$) defines an efficiency of cooling of the target surface 6 by the fluid. The inlets 10, outlets 11, and flow directing features 20 are arranged such that areas of the flow volume 8 with higher heat transfer coefficient are provided in target regions of the target surface where the cooling requirement is higher. The target regions, and therefore the highest heat transfer coefficients, may be close to the edges or corners of a cooled region 7, being a region of the target surface 6 cooled by the fluid flowing through the flow volume 8. As mentioned above, the cooled region 7 may be defined as the smallest polygon (e.g. square, rectangle, hexagon, etc.) that can completely surround all of the regions of the target surface 6 that are directly in contact with the fluid in use. Close to the edges and corners of the cooled region 7, the heat flow path is longer (and therefore the thermal conductive resistance is higher), between the fluid in the flow volume 8 and the opposite side of the target surface 6, which is heated by the heat source 1. This also means that the heat flow path is longer (and therefore the thermal conductive resistance is higher), between the fluid in the flow volume 8 and the heat source 1. Therefore, a higher heat transfer coefficient may be needed close to the corners or edges to prevent peaks in the temperature of the target surface 6 in those regions. This may be achieved by locating one or more of the inlets 10 close to the edges or corners of the fluid channelling structure 4, and/or the cooled region 7. For example, one or more of the inlets 10 may be located within a distance that is less than three times the diameter of an opening of the inlet 10 from an outer boundary of the cooled region 7, optionally less than two times the diameter, optionally less than one times the diameter. If the cooled region 7 comprises a plurality of corners, one or more of the inlets 10 may be located within a distance that is less than three times the diameter of an opening of the inlet 10 from one of the corners, optionally less than two times the diameter, optionally less than one times the diameter.

Figure 4:
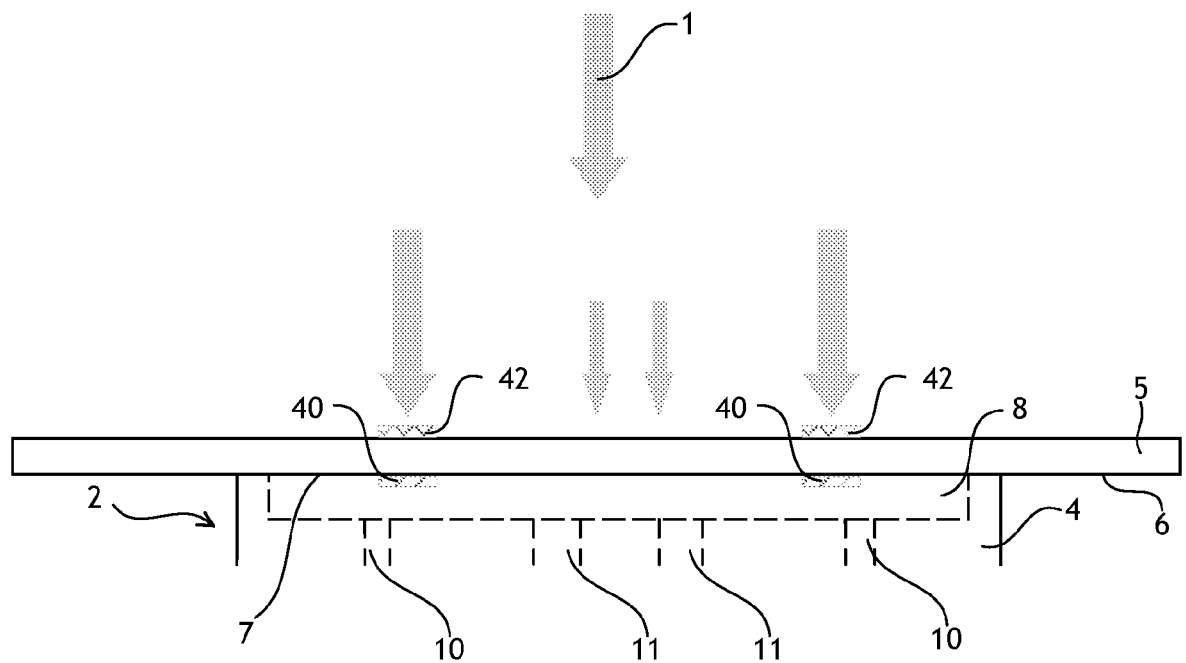
FIG. 4 is a further side-sectional view of the cooling apparatus of FIG. 1.

FIG. 4 shows an embodiment suitable for addressing the case where regions of the target surface 6 which are not at the edges or corners of the cooled region 7 require higher cooling. Target regions 40 where the highest heat transfer coefficient is provided may be regions of the target surface 6 where the cooling requirement is highest. The cooling requirement of a target region 40 of the target surface 6 depends on both the amount of heat applied, and the difficulty of removing the heat. In the case where the opposite side of the target surface 6 is heated by a heat source 1, the amount of heat applied is the heat flux received from the heat source 1 by a region 42 of the opposite side of the target surface 6 directly opposite the target region 40, and the difficulty of removing the heat is characterised by the thermal conductive path length between the target region 40 and the region 42 of the opposite side of the target surface 6 directly opposite the target region 40. The cooling requirement is the product of the heat flux and the thermal conductive path length. This assumes that the same material is being used across the whole heat input area. In a case where plural different materials are used, due account may be taken for the relative thermal conductivities of the materials involved. The cooling requirement will be proportionately higher where the thermal resistance is increased due to the presence of materials having lower thermal conductivity.

In the example of FIG. 4, the thermal conductive path length is the same in the target regions 40 as in other regions of the target surface 6, but the heat flux received by the region 42 of the opposite side of the target surface 6 directly opposite the target region 40 is higher in the target regions 40 than other regions of the target surface 6. Therefore, the cooling requirement of the target regions 40 is higher, and the highest heat transfer coefficient between the target surface 6 and fluid flowing in the flow volume 8 is provided in the target regions 40. The cooling requirement of the target regions 40, being an average of the cooling requirement over the target region 40, may be at least 5% higher than an average cooling requirement, being the cooling requirement averaged over the entire target surface 6, optionally at least 10% higher, optionally at least 15% higher, optionally at least 20% higher. Alternatively, the cooling requirement of the target regions 40, being an average of the cooling requirement over the target region 40, may be at least one standard deviation higher than an average cooling requirement, being the cooling requirement averaged over the entire target surface 6, optionally at least two standard deviations higher, optionally at least three standard deviations higher.

Figure 5:
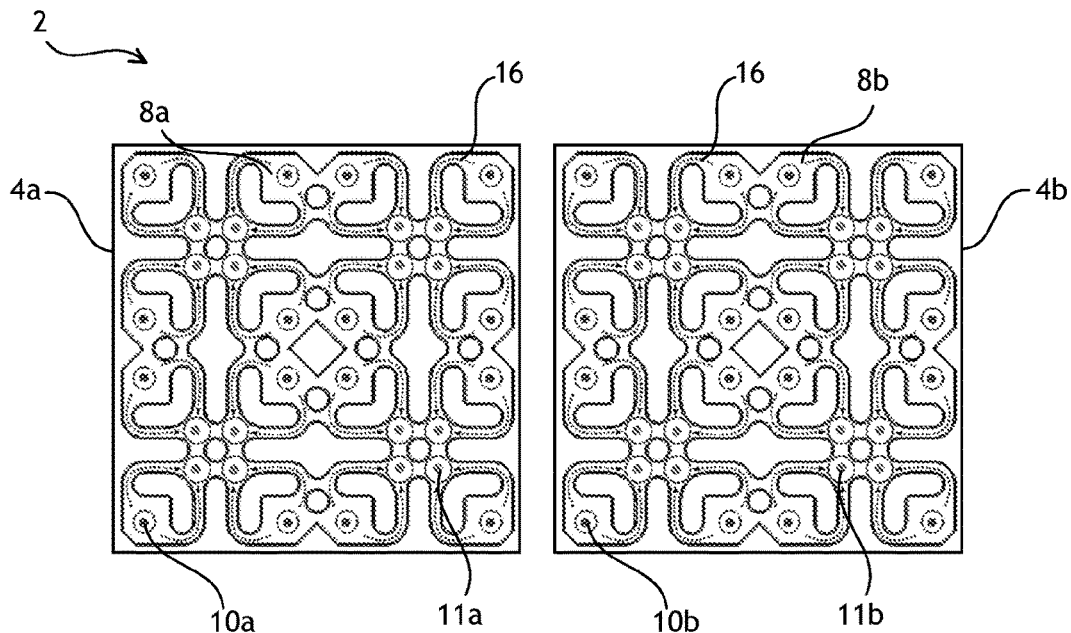
FIGS. 5 and 6 are top-down views of alternative cooling apparatuses comprising multiple fluid channelling structures in a cascade arrangement.

FIG. 5 shows an alternative embodiment where the apparatus 2 comprises a plurality of fluid channelling structures 4 in a cascade arrangement. In the cascade arrangement, fluid flowing out of the flow volume 8a of a first fluid channelling structure 4a through outlets 11a of the first fluid channelling structure 4a subsequently flows into the flow volume 8b of a second fluid channelling structure 4b via inlets 10b of the second fluid channelling structure 4b. Therefore the same fluid flows through multiple flow volumes 8a, 8b. By reusing the fluid in different areas of the target surface 6, the same cooling performance can be obtained using a smaller total flow rate of fluid through the apparatus 2.

In the cascade arrangement, the flow volumes 8 of different fluid channelling structures 4 may be different. This allows the flow rate of fluid through the flow volumes 8 to be controlled, because the same total amount of fluid must pass through the first fluid channelling structures 4a per unit time as through the second fluid channelling structures 4b. For example, a fluid channelling structure 4 with a larger flow volume 8 may feed a fluid channelling structure 4 with a smaller flow volume 8. In this case, the same amount of fluid passes through both fluid channelling structures 4 per unit time, and so the flow rate in the fluid channelling structure 4 with smaller flow volume 8 is higher.

In the cascade arrangement, a fluid channelling apparatus 4 may be fed by multiple other fluid channelling apparatuses 4. In other words, each of the first fluid channelling apparatus and/or the second fluid channelling apparatus may comprises a plurality of fluid channelling apparatuses. For example, all of the fluid flowing out of the flow volumes 8 of both a first and second flow channelling structure 4 may be subsequently fed into the flow volume 8 of a third fluid channelling structure 4.

The cascade arrangement may also comprise a cascade sequence with more than two stages. For example, fluid flowing out of the flow volume 8b of the second fluid channelling structure 4b through outlets 11b of the second fluid channelling structure 4b as discussed above may subsequently flow into the flow volume 8 of a third fluid channelling structure 4 via inlets 10 of the third fluid channelling structure 4. Any number of such stages may be provided. However, if the apparatus 2 comprises a cascade sequence with many stages, the later stages of the sequence may not provide good cooling performance, and so an arrangement with many stages may not be desirable in some situations.

In the cascade arrangement, fluid channelling structures 4 earlier in the cascade sequence (i.e. fluid channelling structures 4 receiving fluid that has previously passed through fewer or no other fluid channelling structures 4) may provide better cooling performance. This is at least in part because the temperature of the fluid is lower. Therefore, the fluid channelling structures 4 earlier in the cascade sequence may be provided in regions of the target surface 6 with a higher cooling requirement, such as defined earlier. For example, the cascade arrangement may be such that fluid flowing out of the flow volume 8a of a first fluid channelling structure 4a engaged with a first sub-region of the target surface 6 flows into the flow volume 8b of a second fluid channelling structure 8b engaged with a second sub-region of the target surface 6. Then the positions of the first and second fluid channelling structures 4a, 4b may be chosen such that the cooling requirement averaged over the first sub-region 7 is higher than the cooling requirement averaged over the second sub-region 7.

Figure 6:
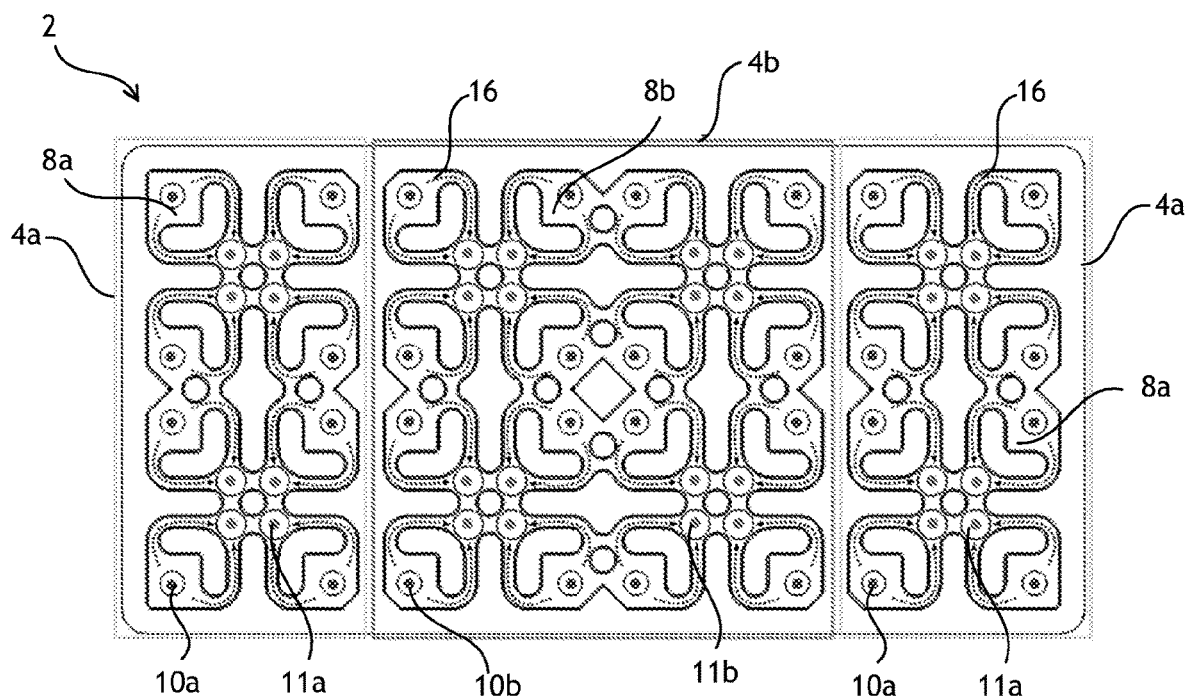

FIG. 6 illustrates the case where there are two first fluid channelling structures 4a with smaller flow volumes 4a both feeding a single second fluid channelling structure 4b with a larger flow volume 8b. In this case, the first fluid channelling structures 4a may cover areas of the target surface 6 requiring higher cooling performance, (i.e. with a higher cooling requirement) and the second fluid channelling structure 4b may cover an area of the target surface 6 requiring lower cooling performance (i.e. with a lower cooling requirement).

Figure 7:
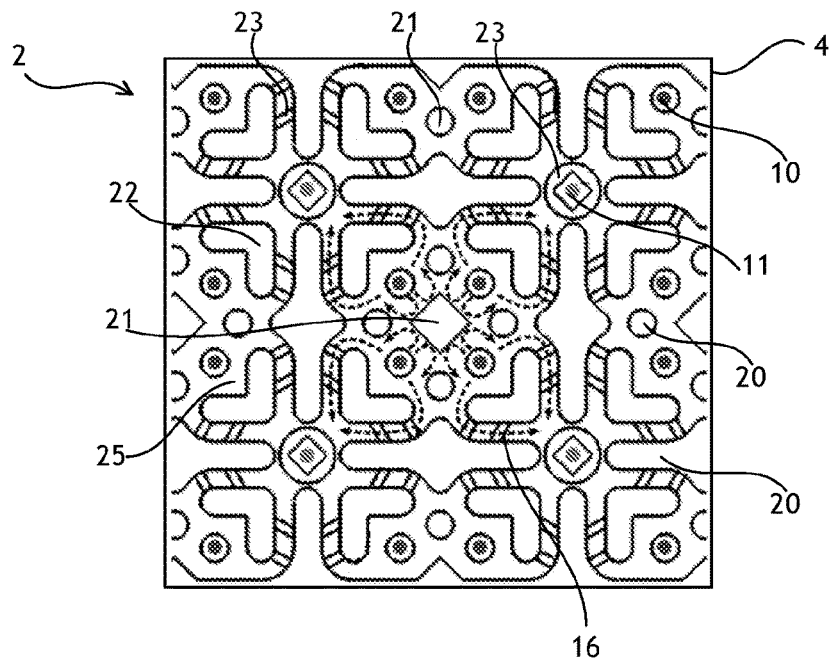
FIG. 7 is a top-down view of an alternative cooling apparatus comprising flow directing features comprising fins.

FIG. 7 shows an alternative design for the apparatus 2. In this design, the flow directing features 20 further comprise fins 23 which do not extend the full height of the channels 25.

Figure 8:
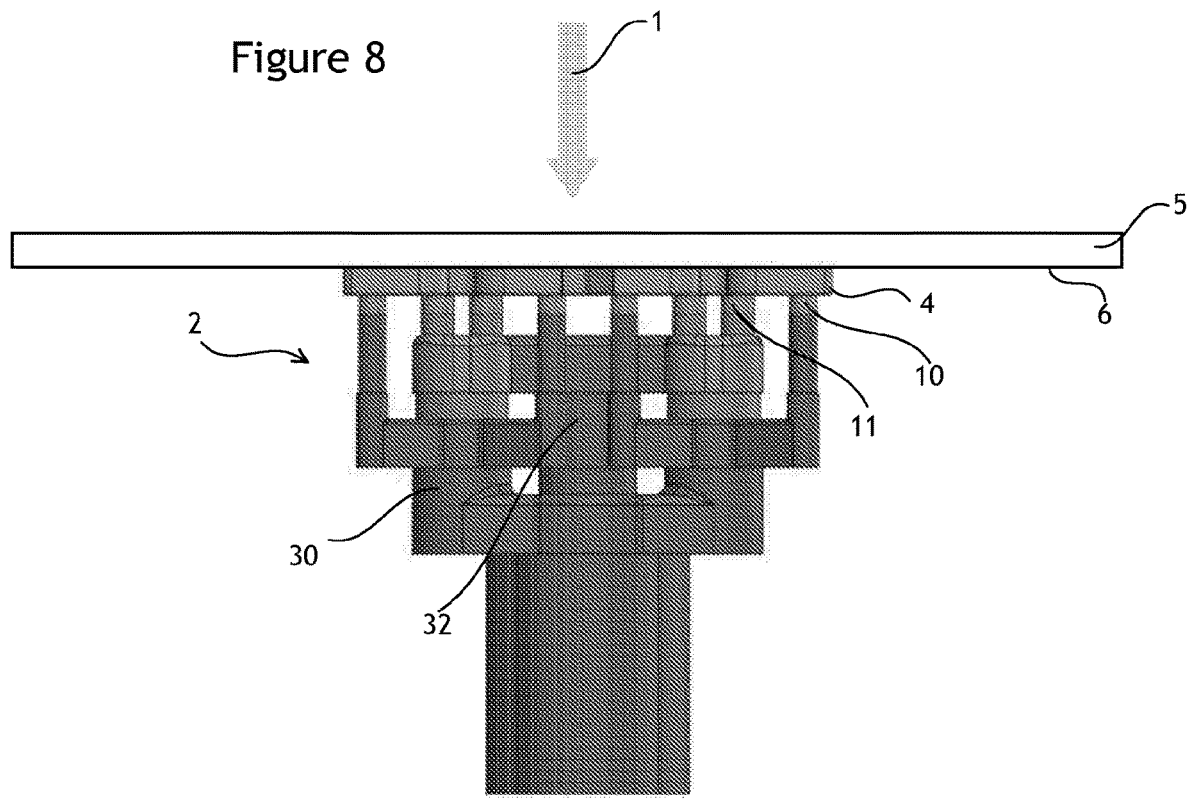
FIG. 8 is a side-sectional view of an alternative cooling apparatus further comprising input and output manifolds.

FIG. 8 shows an embodiment comprising a single fluid channelling structure 4 and further comprising an input manifold 30 and output manifold 32. Fluid enters the apparatus 2 through the input manifold 30, and is directed to the plurality of inlets 10. After leaving the flow volume 8 through the outlets 11, the fluid leaves the apparatus 2 through the output manifold 32. The same cooling performance can be provided for a lower pressure of fluid entering the apparatus 2 if more of the total drop in fluid pressure between the input manifold 30 and output manifold 32 occurs between the inlets 10 and outlets 11. Therefore it is advantageous to configure the apparatus such that a drop in fluid pressure between the inlets 10 and the outlets 11 contributes at least 40%, optionally at least 50%, optionally at least 60% to the total drop in fluid pressure.

The fluid flowing through the flow volume 8 may be water, or may be another fluid such as air. The apparatus 2 may be configured such that fluid flowing through the flow volume 8 does not change state whilst inside the flow volume 8. The apparatus may be configured to receive fluid at pressures between 1 bar and 300 bar, optionally between 10 and 200 bar.

The invention claimed is:

1. A jet impingement cooling apparatus comprising:
a fluid channelling structure configured to engage against a target surface and thereby define a flow volume through which a fluid can flow, the fluid channelling structure comprising:
a plurality of inlets, each inlet opening into the flow volume and configured to allow a fluid to be jetted directly onto the target surface from the inlet and into the flow volume;
a plurality of outlets, each outlet opening into the flow volume and configured to allow the fluid to be removed from the flow volume through the outlet; and
a plurality of flow directing features together forming a plurality of channels fluidly connecting the inlets and the outlets, wherein the flow directing features are arranged such that there is no straight path through the flow volume from a region of the flow volume facing any one of the inlets to a region of the flow volume facing any one of the outlets, wherein:
the flow directing features are configured such that, in use, a time averaged flow direction of fluid in contact with a surface of each flow directing feature is more perpendicular to a direction of jetting of the fluid as the fluid enters the flow volume from a nearest inlet than parallel to said direction of jetting, for a majority of the surface of the flow directing feature;
one or more pairs of the inlets and outlets are configured such that a majority of fluid jetted onto the target surface from the inlet of the pair will be removed from the flow volume through the outlet of the same pair;
the target surface comprises a cooled region that is cooled by the fluid in use; and
at least one of the inlets is provided within a distance less than three times the diameter of an opening of the inlet from an outer boundary of the cooled region.

2. The apparatus of claim 1, wherein the target surface is planar.

3. The apparatus of claim 1, wherein for each said pair of inlets and outlets, a flow path from a region of the flow volume facing the inlet to a region of the flow volume facing the outlet is partially defined by the target surface along all of the flow path such that the fluid is continuously in contact with the target surface along all of the flow path.

4. The apparatus of claim 1, wherein each of one or more of said pairs of inlets and outlets share an outlet.

5. The apparatus of claim 1, wherein, for each of one or more of said pairs of inlets and outlets, a majority of fluid removed from the flow volume through the outlet of the pair is fluid that was jetted onto the target surface through the inlet of the same pair.

6. The apparatus of claim 1, wherein the fluid channelling structure is detachably engageable against the target surface.

7. The apparatus of claim 1, wherein the cooled region comprises a plurality of corners and the at least one of the inlets is provided within a distance less than three times the diameter of an opening of the inlet from one of the corners.

8. The apparatus of claim 1, wherein each of one or more of the flow directing features has a height equal to a distance between an opening of each of one or more of the inlets and the target surface when the fluid channelling structure is engaged against the target surface.

9. The apparatus of claim 1, wherein each of one or more of the flow directing features extends so as to be in direct physical contact with the target surface when the fluid channelling structure is engaged against the target surface.

10. The apparatus of claim 1, wherein:
the apparatus comprises a plurality of the fluid channelling structures in a cascade arrangement; and
the cascade arrangement is such that, in use, fluid flowing out of the flow volume of a first fluid channelling structure of the plurality of fluid channelling structures via outlets of the first fluid channelling structure flows into the flow volume of a second fluid channelling structure of the plurality of fluid channelling structures via inlets of the second fluid channelling structure.

11. The apparatus of claim 10, wherein the size of the flow volume of the first fluid channelling structure is smaller than the size of the flow volume of the second fluid channelling structure.

12. The apparatus of claim 1, wherein a total cross-sectional area of openings of the outlets is larger than a total cross-sectional area of openings of the inlets.

13. The apparatus of claim 1, wherein the fluid channelling structure and flow directing features are configured such that flow in the flow volume is predominantly parallel to the target surface.

14. The apparatus of claim 1, wherein a plurality of the inlets have openings having a diameter between 0.1 mm and 5 mm.

15. The apparatus of claim 1, further comprising an input manifold through which fluid enters the apparatus, and an outlet manifold through which fluid leaves the apparatus, wherein the apparatus is configured such that a drop in fluid pressure between the inlets and the outlets contributes more than 40% to a total drop in fluid pressure between the input manifold and the output manifold.

16. A method of cooling using jet impingement, comprising:
- providing a fluid channelling structure engaged against a target surface to define a flow volume through which a fluid can flow;
- driving a flow of fluid through the flow volume by jetting a fluid into the flow volume through a plurality of inlets and onto the target surface and removing the fluid from the flow volume through a plurality of outlets; and:
- providing a plurality of flow directing features together forming a plurality of channels fluidly connecting the inlets and the outlets, wherein:
- the flow directing features are arranged such that there is no straight path through the flow volume from a region facing any one of the inlets to a region facing any one of the outlets;
- a time averaged flow direction of fluid in contact with a surface of each flow directing feature is more perpendicular to a direction of jetting of the fluid as the fluid enters the flow volume from a nearest inlet than parallel to said direction of jetting, for a majority of the surface of the flow directing feature;
- one or more pairs of the inlets and outlets are such that a majority of fluid jetted onto the target surface from the inlet of the pair is removed from the flow volume through the outlet of the same pair;
- the target surface comprises a cooled region that is cooled by the fluid in use; and
- at least one of the inlets is provided within a distance less than three times the diameter of an opening of the inlet from an outer boundary of the cooled region.

17. The method of claim 16, wherein:
- the target surface is heated by a heat source on an opposite side of the target surface to the fluid channelling structure; and
- a highest heat transfer coefficient between the target surface and fluid flowing in the flow volume is provided in each of one or more target regions of the target surface; and
- each target region has a cooling requirement, averaged over the target region, that is at least 5% higher than an average cooling requirement, averaged over the whole target surface, wherein
- the cooling requirement is defined as the product of the heat flux from the heat source received by a region of the opposite side of the target surface directly opposite the target region, and the thermal conductive path length between the target region and the region of the opposite side of the target surface directly opposite the target region.

18. The method of claim 16, wherein:
- the target surface is heated by a heat source on an opposite side of the target surface to the fluid channelling structure;
- a highest heat transfer coefficient between the target surface and fluid flowing in the flow volume is provided in each of one or more target regions of the target surface, wherein:
- each target region has a cooling requirement, averaged over the target region, that is at least one standard deviation higher than an average cooling requirement, averaged over the whole target surface, wherein
- the cooling requirement is defined as the product of the heat flux from the heat source received by a region of the opposite side of the target surface directly opposite the target region, and the thermal conductive path length between the target region and the region of the opposite side of the target surface directly opposite the target region.

19. The method of claim 16, wherein the fluid jetted from the inlets does not change phase whilst inside the flow volume.

20. The method of claim 16, wherein the fluid is jetted from the inlets in a flow having a Reynolds number greater than 4000.

21. The method of claim 16, wherein fluid is provided to the inlets at a pressure between 1 bar and 300 bar.

22. The method of claim 16, wherein:
- a plurality of the fluid channelling structures are provided in a cascade arrangement; and
- the cascade arrangement is such that fluid that flows out of the flow volume of a first fluid channelling structure of the plurality of fluid channelling structures via outlets of the first fluid channelling structure flows into the flow volume of a second fluid channelling structure of the plurality of fluid channelling structures via inlets of the second fluid channelling structure.

23. The method of claim 22, wherein:
- the target surface is heated by a heat source on an opposite side of the target surface to the fluid channelling structures;
- the first fluid channelling structure is engaged with a first sub-region of the target surface and the second fluid channelling structure is engaged with a second sub-region of the target surface; and
- a cooling requirement of the first sub-region is higher than a cooling requirement of the second sub-region; wherein:
- the cooling requirement of the first sub-region is defined as the average over the first sub-region of the product of the heat flux received from the heat source by a first region of the opposite side of the target surface directly opposite the first sub-region, and the thermal conductive path length between the first sub-region and the first region of the opposite side of the target surface directly opposite the first sub-region; and
- the cooling requirement of the second sub-region is defined as the average over the second sub-region of the product of the heat flux received from the heat source by a second region of the opposite side of the target surface directly opposite the second sub-region, and the thermal conductive path length between the second sub-region and the second region of the opposite side of the target surface directly opposite the second sub-region.

24. The method of claim 22, wherein the first fluid channelling structure comprises a plurality of fluid channelling structures and/or the second fluid channelling structure comprises a plurality of fluid channelling structures.

* * * * *